(12) United States Patent
Fishburn

(10) Patent No.: US 6,707,088 B2
(45) Date of Patent: Mar. 16, 2004

(54) METHOD OF FORMING INTEGRATED CIRCUITRY, METHOD OF FORMING A CAPACITOR, METHOD OF FORMING DRAM INTEGRATED CIRCUITRY AND DRAM INTEGRATED CATEGORY

(75) Inventor: Fred Fishburn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 3 days.

(21) Appl. No.: 10/209,820

(22) Filed: Jul. 31, 2002

(65) Prior Publication Data

US 2003/0022437 A1 Jan. 30, 2003

Related U.S. Application Data

(62) Division of application No. 09/516,633, filed on Mar. 1, 2000, now Pat. No. 6,475,855.

(51) Int. Cl.[7] .............................................. H01L 27/108
(52) U.S. Cl. ........................ 257/296; 257/68; 257/71; 257/298; 257/300; 257/301; 257/906; 257/908
(58) Field of Search ...................... 257/68–71, 296–313, 257/905–908

(56) References Cited

U.S. PATENT DOCUMENTS

| | | | | |
|---|---|---|---|---|
| 5,629,539 A | * | 5/1997 | Aoki et al. ................. | 257/306 |
| 5,691,252 A | | 11/1997 | Pan ............................. | 437/919 |
| 5,990,507 A | * | 11/1999 | Mochizuki et al. ......... | 257/295 |
| 6,174,735 B1 | * | 1/2001 | Evans .......................... | 438/3 |
| 6,245,631 B1 | * | 6/2001 | Agarwal et al. ............ | 438/396 |
| 6,278,150 B1 | | 8/2001 | Okudaira et al. ........... | 257/306 |
| 6,291,292 B1 | | 9/2001 | Yang .......................... | 438/241 |
| 6,337,274 B1 | * | 1/2002 | Hu et al. .................... | 438/653 |

* cited by examiner

Primary Examiner—Hoai Ho
Assistant Examiner—Andy Huynh
(74) Attorney, Agent, or Firm—Wells St. John P.S.

(57) ABSTRACT

In one implementation, integrated circuitry includes a first capacitor electrode layer received over a substrate. A capacitor dielectric layer is received over the first capacitor electrode layer. The capacitor dielectric layer has an edge terminus. A second capacitor electrode layer is received over the capacitor dielectric layer. The first capacitor electrode layer and the second capacitor electrode layer, respectively, have opposing lateral edges. The capacitor dielectric layer edge terminus is laterally coincident with at least a portion of one of the opposing lateral edges of the second capacitor electrode layer. An insulative silicon nitride including cap is received over the capacitor dielectric layer edge terminus and the one opposing lateral edge of the second capacitor electrode layer. The cap does not contact any portion of the opposing lateral edges of the first capacitor electrode layer. Other aspects and implementations are disclosed.

20 Claims, 14 Drawing Sheets

US 6,707,088 B2

METHOD OF FORMING INTEGRATED CIRCUITRY, METHOD OF FORMING A CAPACITOR, METHOD OF FORMING DRAM INTEGRATED CIRCUITRY AND DRAM INTEGRATED CATEGORY

CROSS REFERENCE TO RELATED APPLICATION

This application is a divisional of U.S. patent application Ser. No. 09/516,633, which was filed on Mar. 1, 2000 now U.S. Pat. No. 6,475,855 and which is incorporated by reference herein.

TECHNICAL FIELD

This invention relates to methods of forming integrated circuitry, to methods of forming a capacitor, to methods of forming DRAM integrated circuitry, to integrated circuitry and to DRAM integrated circuitry.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs and beyond will be on the order of 0.25 micron or less, and conventional dielectrics such as $SiO_2$ and $Si_3N_4$ might not be suitable because of small dielectric constants.

Highly integrated memory devices, such as 256 Mbit DRAMs and beyond, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness. Insulating inorganic metal oxide materials, such as $Ta_2O_5$ and barium strontium titanate, have high dielectric constants and low leakage current which make them attractive as cell dielectric materials for high density DRAMs and non-volatile memories. All of these materials incorporate oxygen and are otherwise exposed to oxygen and anneal for densification to produce the desired capacitor dielectric layer. In many of such applications, it will be highly desirable to utilize metal for the capacitor electrodes, thus forming a metal-insulator-metal capacitor.

DRAM and other circuitry having devices using high dielectric constant dielectric materials are expected to be sensitive to high temperature processing in hydrogen containing ambients. Presently, most all integrated circuitry fabrication includes a final hydrogen atmosphere anneal to facilitate one or more of aluminum alloying, of threshold voltage ($V_t$) adjustment, of junction leakage stabilization and of dangling bond repair in the typical bulk monocrystalline silicon substrate. Hydrogen is a very diffusive material, typically diffusing into and through the overlying layers to the bulk substrate during the high temperature hydrogen anneal. Unfortunately, hydrogen remaining in high dielectric constant capacitor dielectrics has a significant adverse effect on current leakage in the capacitor, potentially leading to complete failure of the capacitor and corresponding destruction of the DRAM cell.

Overcoming such problem in DRAM circuitry fabrication was a motivation for the invention, but the invention is in no way so limited.

SUMMARY

The invention comprises a method of forming integrated circuitry, a method of forming a capacitor, a methods of forming DRAM integrated circuitry, integrated circuitry and DRAM integrated circuitry. In but one implementation, a method of forming integrated circuitry includes forming a first capacitor electrode layer over a substrate. A capacitor dielectric layer is formed over the first capacitor electrode layer. A second capacitor electrode layer is formed over the capacitor dielectric layer and a capacitor is formed comprising the first capacitor electrode layer, the capacitor dielectric layer and the second capacitor electrode layer. A silicon nitride comprising layer is physical vapor deposited over the second capacitor electrode layer. A final passivation layer is formed over the physical vapor deposited silicon nitride comprising layer.

In one implementation, integrated circuitry includes a first capacitor electrode layer received over a substrate. A capacitor dielectric layer is received over the first capacitor electrode layer. A second capacitor electrode layer is received over the capacitor dielectric layer. The first capacitor electrode layer, the capacitor dielectric layer and the second capacitor electrode layer comprise a capacitor. A silicon nitride comprising layer is received over the second capacitor electrode layer. At least a portion of the silicon nitride comprising layer contacts at least a portion of the second capacitor electrode layer.

Other aspects and implementations are disclosed or contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention comprises methods of fabricating integrated circuitry, and integrated circuitry independent of the method of fabrication. A preferred embodiment is described in conjunction with fabrication of DRAM integrated circuitry and in a finished DRAM integrated circuitry product. The invention has applicability to methods of fabricating other integrated circuitry, and to other integrated circuitry products independent of method of fabrication as will be appreciated by the artisan, with the invention only being limited by the accompanying claims appropriately interpreted in accordance with the Doctrine of Equivalents.

Figure 1:
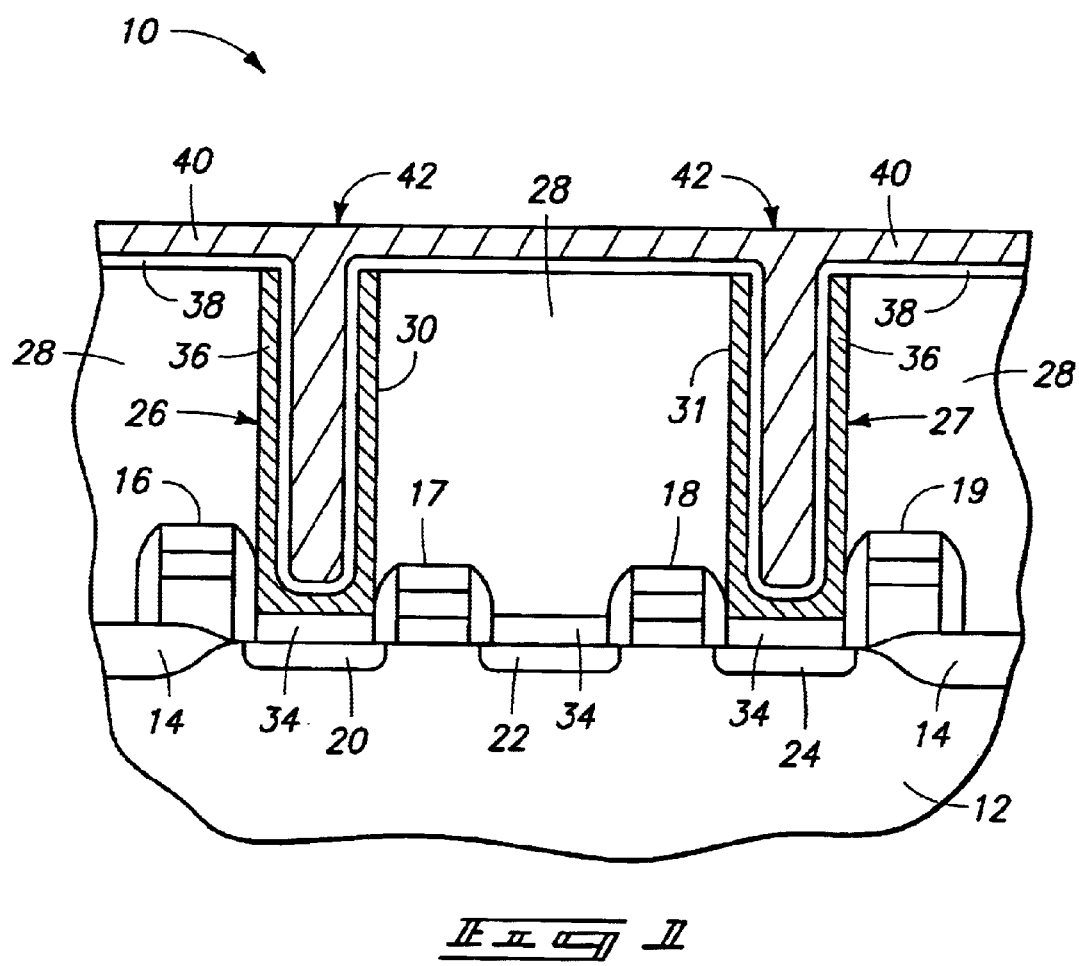
FIG. 1 is a diagrammatic sectional view of a semiconductor wafer fragment comprising example DRAM integrated circuitry in fabrication in accordance with an aspect of the invention.

Referring to FIG. 1, a wafer fragment 10 comprises a bulk monocrystalline silicon substrate 12 having a pair of field isolation regions 14. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A series of four DRAM word line constructions 16, 17, 18 and 19 are formed over the illustrated substrate, and comprise gates of respective DRAM cell field effect transistors. Gate constructions 16, 17, 18 and 19 are conventional as shown, and comprise a gate dielectric layer (not shown), an overlying conductive polysilicon region, an overlying higher conductive elemental metal or silicide region, and an insulative cap and sidewall spacers, and which are not otherwise specifically identified with numerals. In the illustrated section, word line 17 comprises a transistor access gate having associated source/drain diffusion regions 20 and 22 formed within monocrystalline silicon substrate 12. Similarly, DRAM word line 18 comprises a gate of a DRAM cell field effect transistor having an associated pair of source/drain diffusion regions 22 and 24. Such depicts two DRAM cells which share a source/drain region 22 which will electrically connect with a bit line, as described subsequently. The other respective source/drain diffusion regions 20 and 24 are formed in electrical connection with DRAM cell capacitor constructions 26 and 27, respectively. The illustrated example is in the fabrication of bit line-over-capacitor DRAM integrated circuitry construction, although other DRAM integrated circuitry and other integrated circuitry constructions and fabrication methods are contemplated.

Conductive covering regions 34 are formed over source/drain regions 20, 22 and 24. Such might be formed to have outermost surfaces or tops which are received elevationally below the outermost top surfaces of gate constructions 16–19 as shown, or received elevationally thereabove (not shown). Such might comprise conductive polysilicon, metals, and/or metal compounds, including conductive barrier layer materials.

An insulating layer 28, for example borophosphosilicate glass (BPSG), is formed over the word lines and is planarized as shown. An antireflective coating layer or layers (not shown) might preferably comprise an outermost portion of layer 28, and comprise silicon oxynitride which can also function as a diffusion barrier to hydrogen and other gases. Capacitor container openings 30 and 31 are formed within insulative layer 28 over source/drain diffusion regions 20 and 24, respectively, and the associated conductive covering regions 34. A diffusion barrier layer (i.e., preferably $Si_3N_4$ at a preferred thickness of from about 100 Angstroms to about 300 Angstroms, and not shown in this embodiment) can be formed over layer 28 and to line the sidewalls of openings 30 and 31. A capacitor storage node layer 36 is formed within container openings 30 and 31 in electrical connection with source/drain diffusion regions 20 and 24 through conductive covering/plugging material 34. Such can be planarized back to be isolated within the container openings as shown. Example materials include conductively doped polysilicon, metal and metal compounds, with conductive metal, metal oxides and metal alloys being preferred materials in a metal-insulator-metal capacitor construction. Example conductive metals include platinum, ruthenium, alloys including one or more of platinum and ruthenium, and ruthenium oxide.

A capacitor dielectric layer 38 is formed over storage node electrode layer 36. Example and preferred materials include high k dielectric materials, such as titanates and pentoxides. A DRAM capacitor cell electrode layer 40 is formed over capacitor dielectric layer 38. Cell electrode layer 40 is preferably common to multiple capacitors of the DRAM circuitry, and preferably comprises a metal or metal alloy. For purposes of the continuing discussion, cell electrode layer 40 comprises an outer surface 42.

Figure 2:
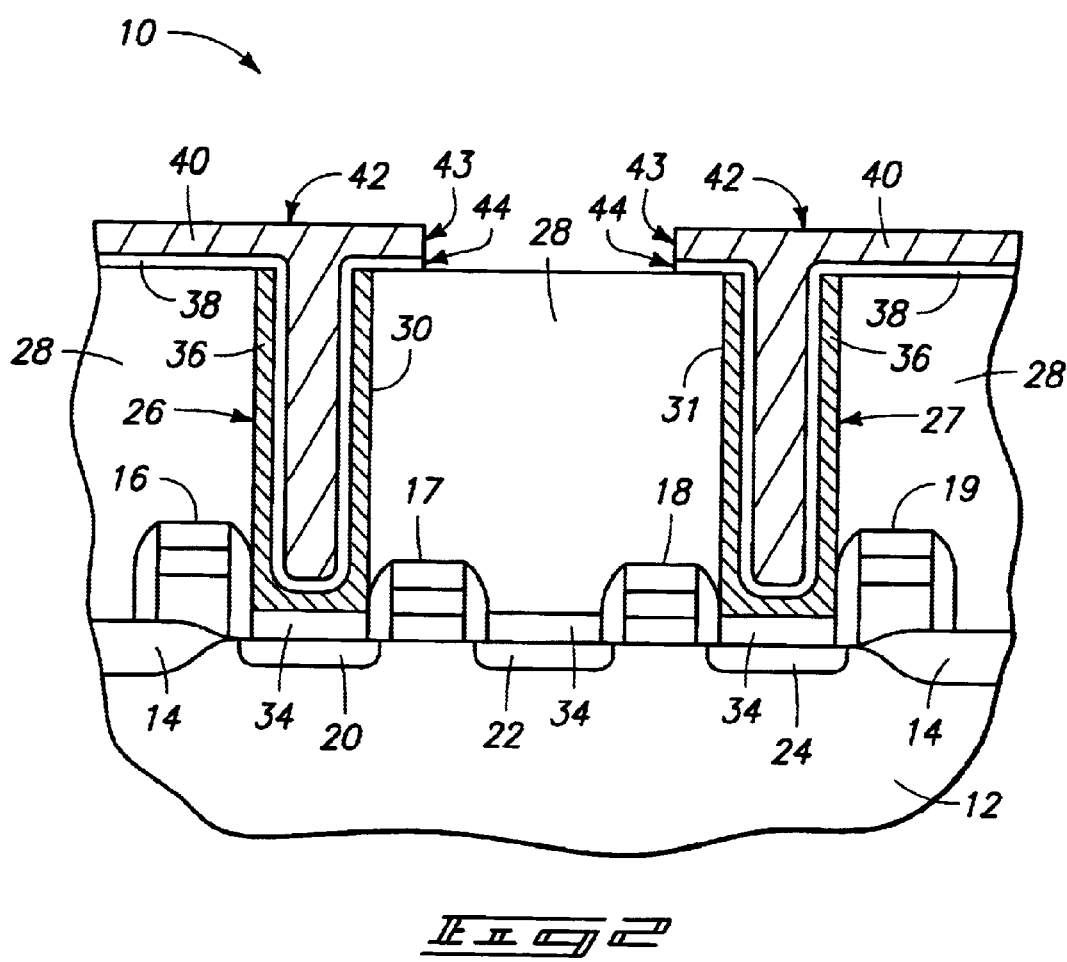
FIG. 2 is a view of the FIG. 1 wafer fragment at a processing step subsequent to that depicted by FIG. 1.

Referring to FIG. 2, selected portions of cell electrode layer 40 and capacitor dielectric layer 38 are removed, forming an exposed edge terminus 43 of cell electrode layer 40 and an exposed edge terminus 44 of capacitor dielectric layer 38. Accordingly, layer 40 is patterned as desired and shown to provide an opening therethrough to ultimately achieve bit line electrical connection with shared diffusion region 22, and to otherwise form a desired circuitry pattern thereof outwardly of the depiction of FIG. 1.

Such depicts but one example of forming a first capacitor electrode layer over a substrate, a capacitor dielectric layer over the first capacitor electrode layer, and a second capacitor electrode layer over the capacitor dielectric layer, and forming a capacitor comprising at least three such layers.

Figure 3:
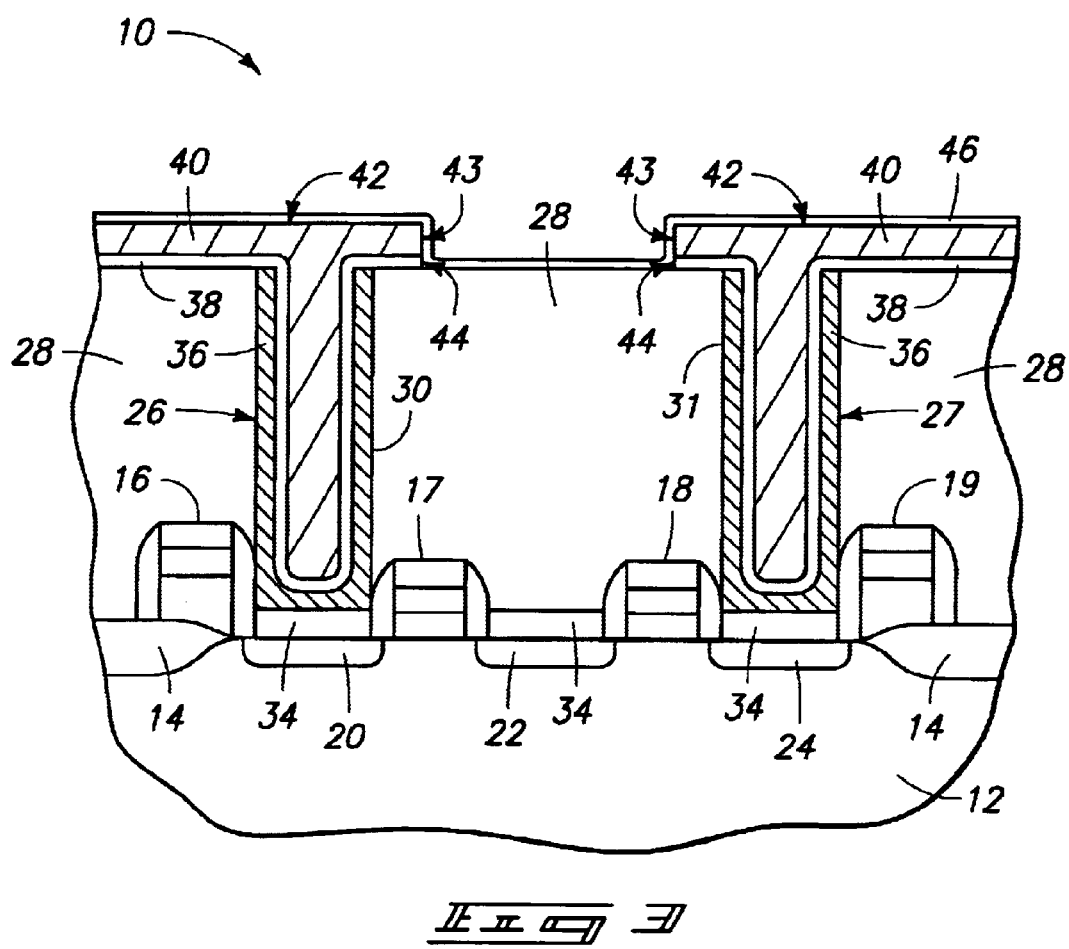
FIG. 3 is a view of the FIG. 1 wafer fragment at a processing step subsequent to that depicted by FIG. 2.

Referring to FIG. 3, an electrically insulative layer 46 is deposited over second capacitor electrode layer 40, second capacitor electrode layer edge terminus 43, and capacitor dielectric layer exposed edge terminus 44. Most preferably, such is formed by physical vapor depositing a silicon nitride comprising layer over second capacitor/cell electrode layer 40, and more preferably to contact at least a portion of second capacitor/cell electrode layer 40 as shown. A preferred thickness for layer 46 is 500 Angstroms. Further, layer 46 as shown is preferably deposited to be on (i.e., contacting) exposed edge termini 43 and 44. Further, layer 46 is preferably physical vapor deposited to consist essentially of silicon nitride. Further in the illustrated embodiment, the physical vapor deposited silicon nitride layer contacts all of outer surface 42 of cell electrode layer 40. Further, capacitor dielectric layer edge terminus 44 is laterally coincident with at least a portion of second capacitor electrode layer edge terminus 43. Further, silicon nitride comprising layer 46 in the preferred embodiment thereby comprises a cap which is received over the capacitor dielectric layer edge terminus 44.

An example most preferred technique is to physical vapor deposit by sputtering using an $N_2$ ambient. By way of example only, a sputtering example comprises use of a $Si_3N_4$ target within an AC powered Endura system available from Applied Materials of Santa Clara, Calif. Example conditions in such a system include a power range from about 500 Watts to about 8000 Watts, pressure at from about 2 mTorr to about 8 mTorr, wafer temperature maintained from about 0° C. to about 400° C., bias voltage from about 0 Volt to about 400 Volts, and Ar gas flow at from about 5 sccm to about 100 sccm.

Figure 4:
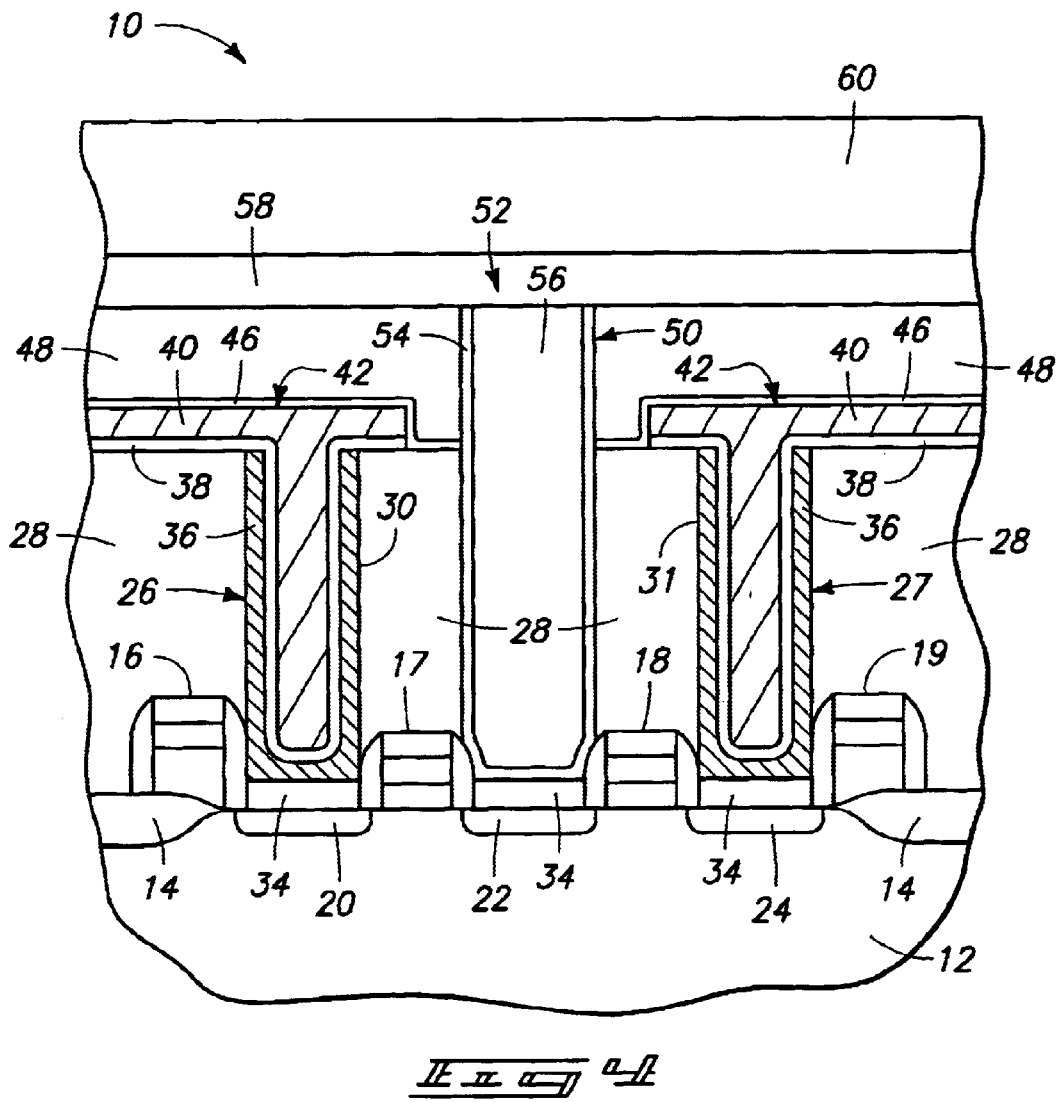
FIG. 4 is a view of the FIG. 1 wafer fragment at a processing step subsequent to that depicted by FIG. 3.

Referring to FIG. 4, an insulative layer 48, preferably BPSG, is formed over physical vapor deposited silicon nitride comprising layer 46. A contact opening 50 is formed through layer 48, layer 46 and layer 28 over bit contact source/drain diffusion region 22. Exposure to an $H_2$ atmosphere for density stabilization can also be conducted, advantageously without adversely affecting the capacitor. Such is preferably plugged with a conductive plugging material 52. In the illustrated example, such comprises a conductive titanium and/or titanium nitride lining layer 54 and a conductive metal plugging material 56, such as tungsten. A DRAM bit line 58 is formed outwardly of insulative layer 48, and thereby outwardly of physical vapor deposited silicon nitride comprising layer 46, and in electrical contact with bit line plugging material 52. Other conductive layers and/or integrated circuit devices (not shown) might be formed outwardly of bit line 58. A final passivation layer 60 is shown being formed over bit line 58 and physical vapor deposited silicon nitride comprising layer 46. Such preferably comprises one or both of silicon dioxide or silicon nitride which is chemical vapor deposited.

The substrate is preferably annealed in a hydrogen comprising atmosphere for any or all of the purposes described above in the background section, or for other purposes. Such might occur before and/or after formation of layer 60. Regardless, layer 46 in such instance preferably functions as a diffusion barrier for such hydrogen and other potentially harmful gases from entering and adversely affecting capacitor dielectric layer 38. Layer 46 also can function as a diffusion barrier for other gases, such as $N_2$ and $NH_3$, and other potentially harmful gases during intermediate or subsequent processing. Further, such diffusion barrier layer during any annealing for the capacitor 11 dielectric layer can further function to trap volatile gases, such as $O_2$, inside the capacitor stack. Most preferably, layer 46 is deposited by physical vapor deposition, as opposed to chemical vapor deposition methods which typically employ hydrogen or other gases during the deposition and ultimately do not effectively form a barrier to subsequent diffusion as does physical vapor deposited silicon nitride.

Figure 5:
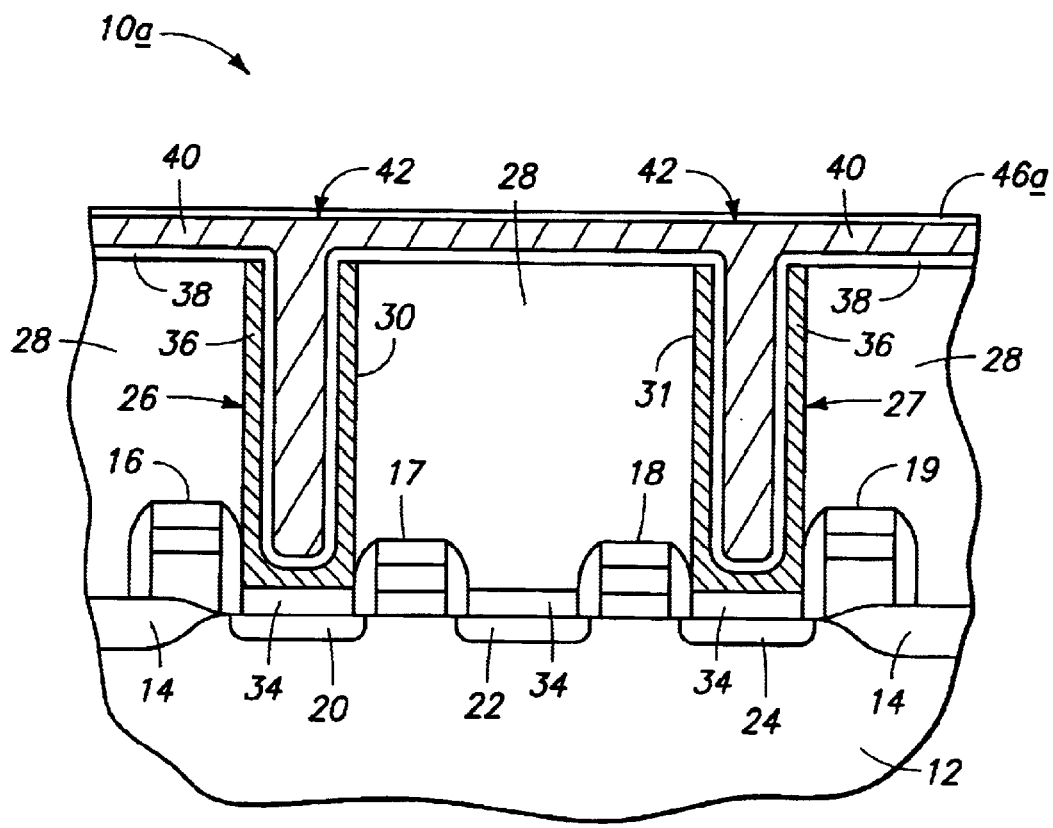
FIG. 5 is a view of an alternate embodiment to that depicted by FIG. 1.

But one alternate embodiment in fabrication of bit line-over-capacitor DRAM circuitry is described with reference to FIGS. 5–7. Like numerals from the first described embodiment are utilized where appropriate, with differences being indicated with the suffix "a" or with different numerals. FIG. 5 depicts a semiconductor wafer fragment 10a just prior to DRAM cell electrode layer 40 patterning. A silicon nitride comprising layer 46a has been physical vapor deposited over cell electrode layer 40.

Figure 6:
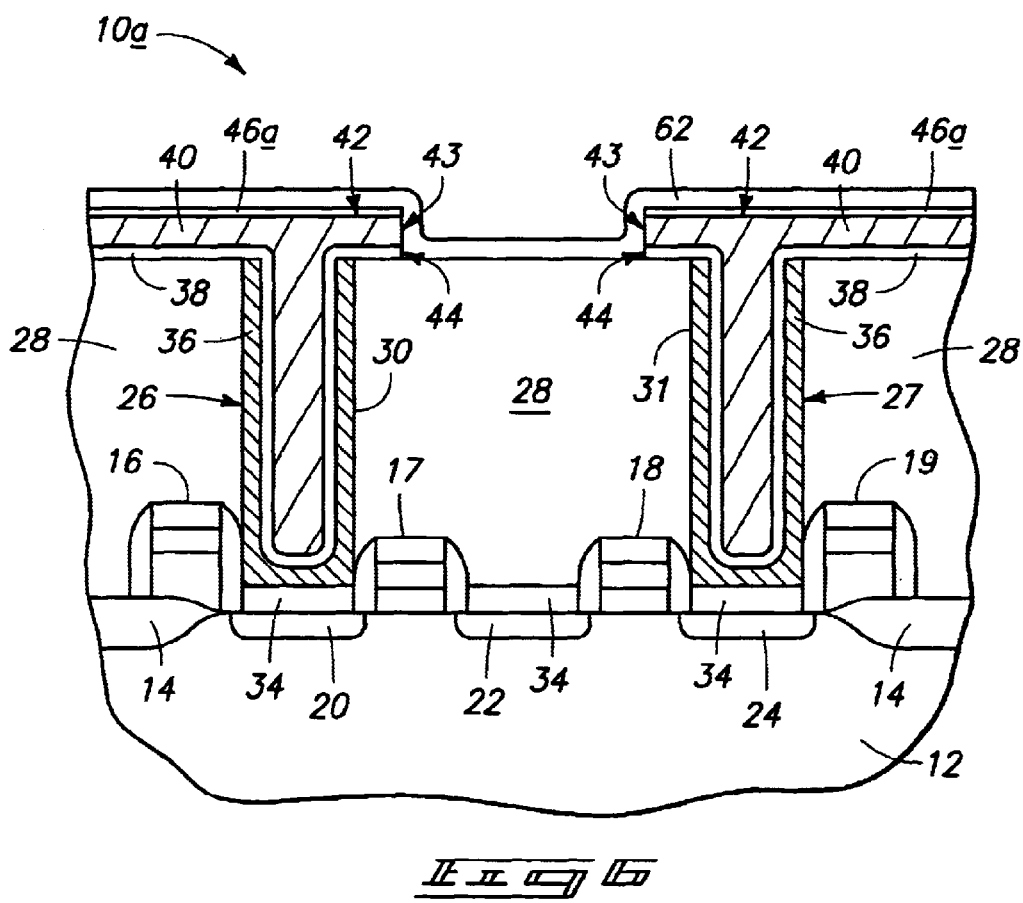
FIG. 6 is a view of the FIG. 5 wafer fragment at a processing step subsequent to that depicted by FIG. 5.
Figure 7:
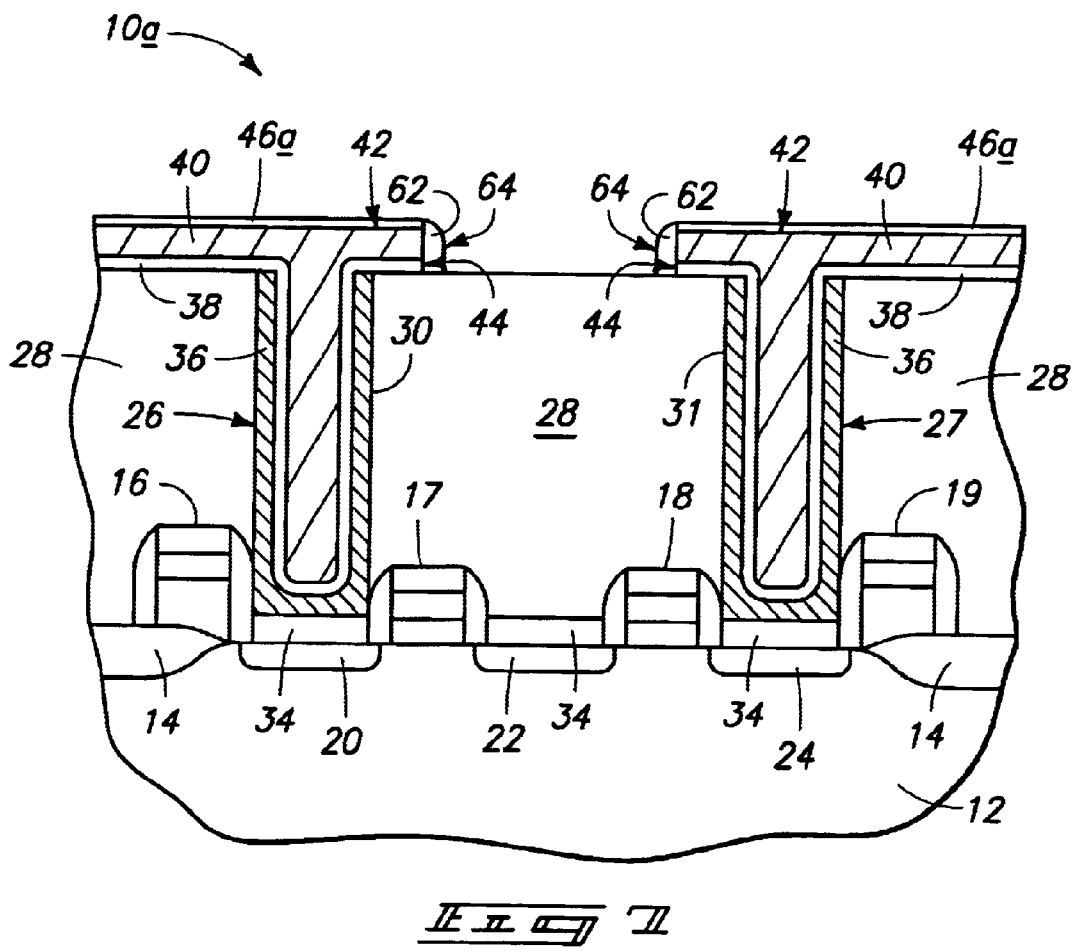
FIG. 7 is a view of the FIG. 5 wafer fragment at a processing step subsequent to that depicted by FIG. 6.

Referring to FIG. 6, selected portions of physical vapor deposited silicon nitride comprising layer 46a, cell electrode layer 40, and capacitor dielectric layer 38 are removed in a common masking step. Subsequently, an electrically insulative layer 62 is deposited over physical vapor deposited silicon nitride comprising layer 46a and capacitor dielectric layer edge terminus 44. Layer 62 also preferably comprises a silicon nitride comprising layer deposited by physical vapor deposition. Subsequent processing can proceed as described above with respect to the first described embodiment, or in other manners. Alternately by way of example only, and with reference to FIG. 7, electrically insulative layer 62 is anisotropically etched to form insulative sidewall spacers 64 over capacitor dielectric layer edge terminus 44. Processing could then otherwise proceed as described above with respect to the first described embodiment, or in other manners. Such spacers 64 preferably provide an effective diffusion barrier over capacitor dielectric layer exposed edge terminus 44. The invention also contemplates such formation of a spacer over a capacitor dielectric layer exposed edge terminus independent of whether a previous deposition of layer 46a has occurred.

Figure 8:
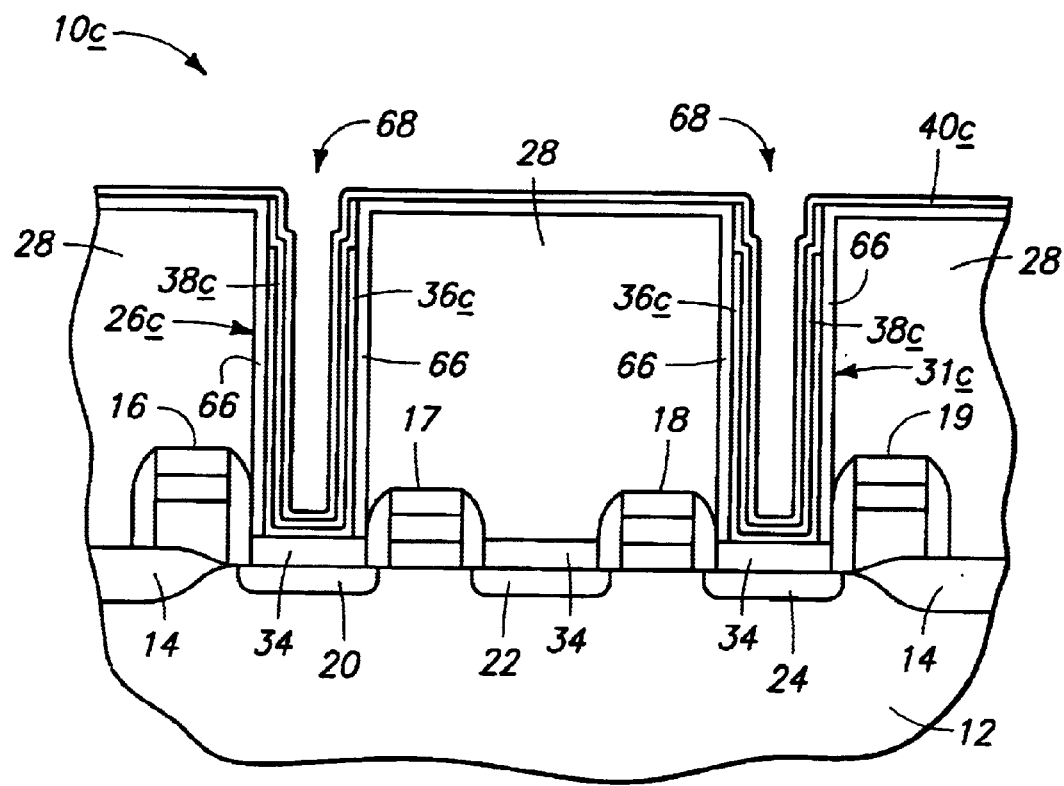
FIG. 8 is a view of another alternate embodiment to that depicted by FIG. 1.

Yet another alternate and preferred bit line over capacitor DRAM integrated circuitry fabrication method and circuitry is described with reference to FIGS. 8–11. Like numerals from the first described embodiment are utilized where appropriate, with differences being indicated with a suffix "c" or with different numerals. FIG. 8 depicts a wafer fragment 10c having container openings 26c and 31c. Such might be fabricated to be the same size as the above-described embodiments or slightly wider. The outer surface of layer 28 and sidewalls of container openings 26c and 31c are lined with a diffusion barrier material 66. Such might be deposited in a hydrogen ambient, as hydrogen can be diffused out of the structure subsequently before capacitor formation is complete. One example and preferred material for the lining 66 is thermal CVD $Si_3N_4$. Alternately, a physical vapor deposited silicon nitride comprising layer might be used for layer 66 if adequate conformality in the deposition could be achieved.

DRAM cell capacitor storage node layer 36c and a capacitor dielectric layer 38c are formed within container openings 26c and 31c as shown. A DRAM cell capacitor cell electrode layer 40c is formed within container openings 26c and 31c over capacitor dielectric layer 38c, leaving remaining unfilled volume 68 within the respective container openings.

Figure 9:
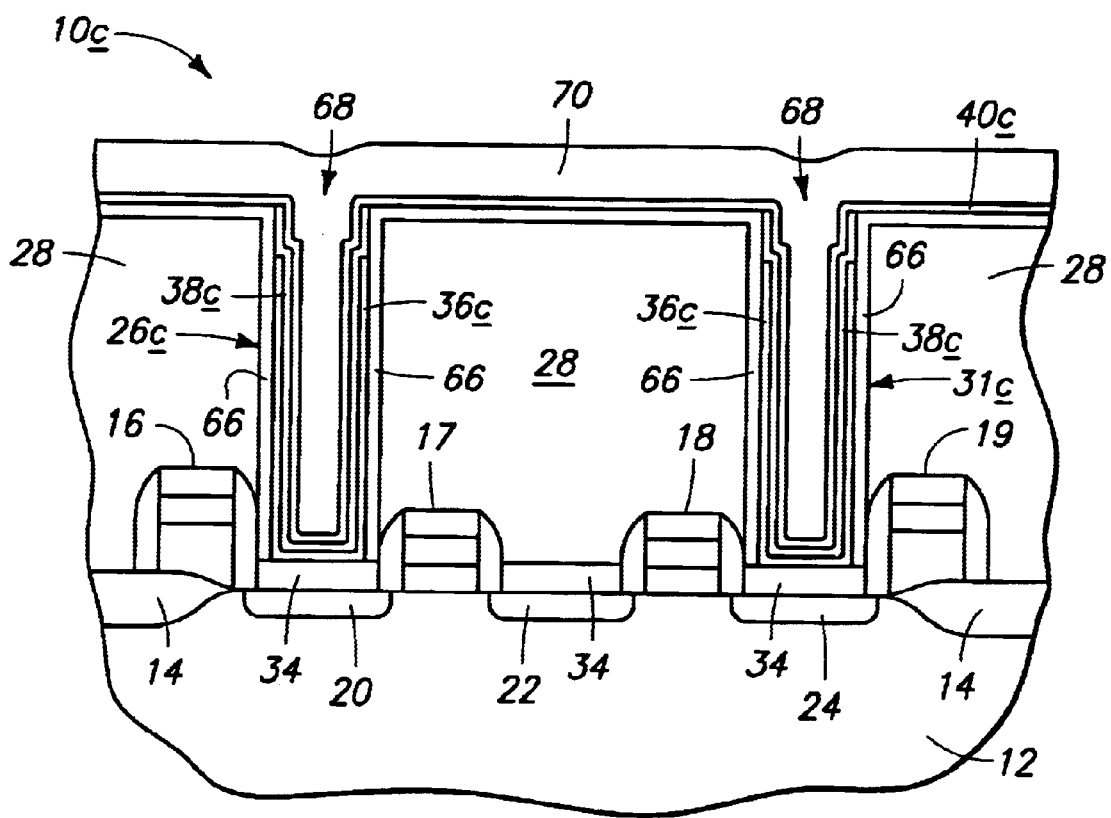
FIG. 9 is a view of the FIG. 8 wafer fragment at a processing step subsequent to that depicted by FIG. 8.

Referring to FIG. 9, such unfilled remaining volume is filled with an electrically insulative material 70, with phosphosilicate glass (PSG) being but one example.

Figure 10:
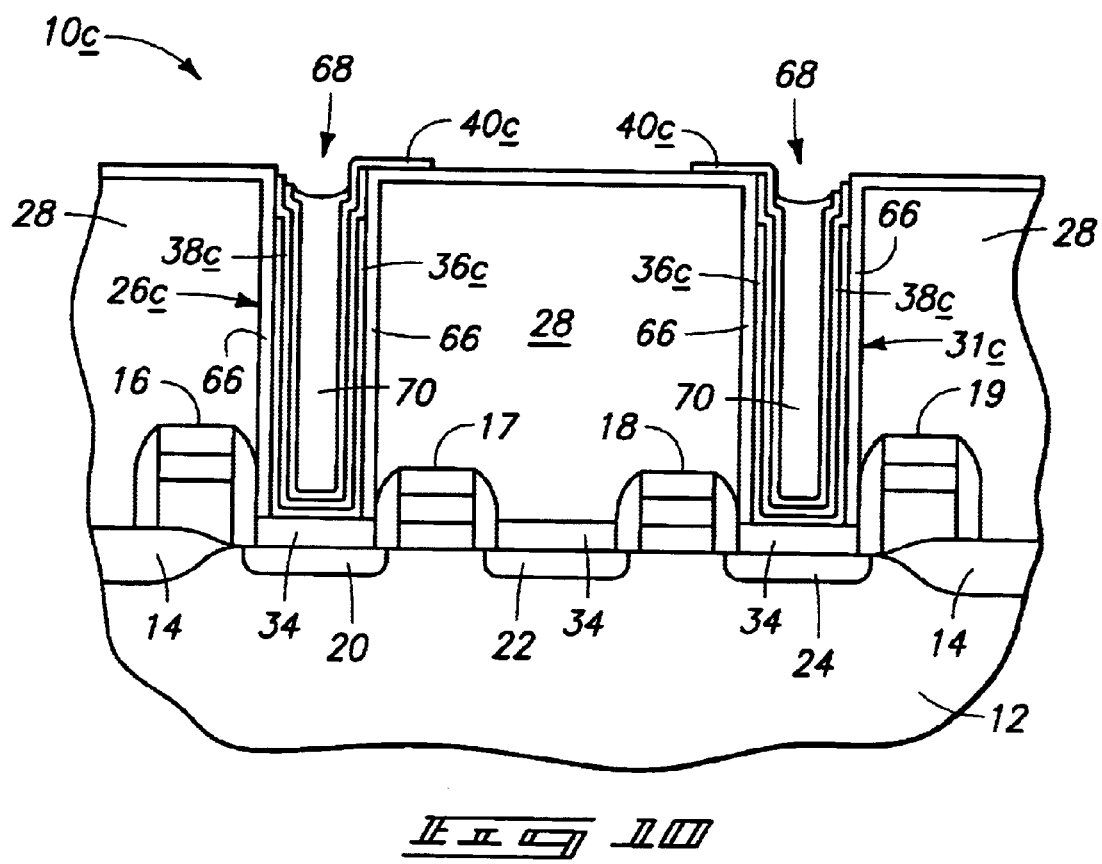
FIG. 10 is a view of the FIG. 8 wafer fragment at a processing step subsequent to that depicted by FIG. 9.

Referring to FIG. 10, insulative material layer 70 is etched back and selected portions of cell electrode layer 40c are preferably patterned and removed as shown to form a continuous and single common cell electrode 40c.

Figure 11:
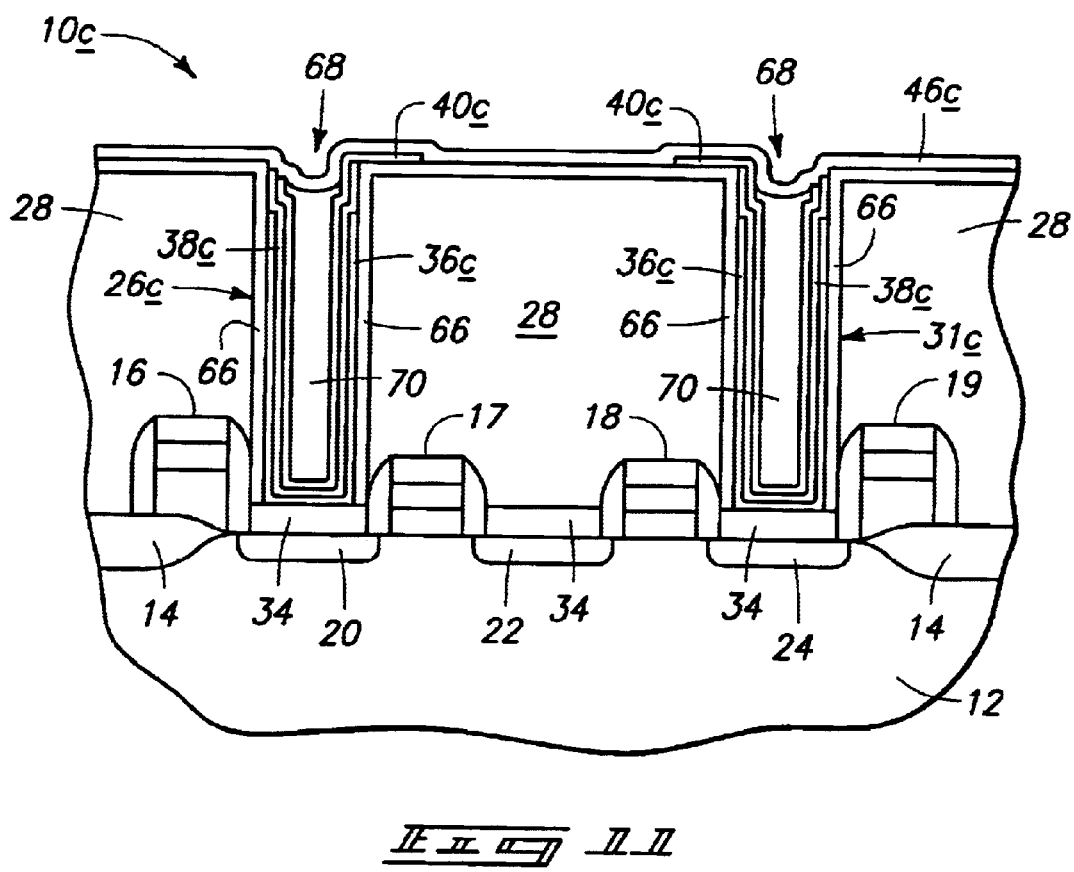
FIG. 11 is a view of the FIG. 8 wafer fragment at a processing step subsequent to that depicted by FIG. 10.

Subsequently and referring to FIG. 11, a silicon nitride comprising layer 46c is physical vapor deposited over substrate 10c. Preferably as shown, such contacts at least a portion of cell dielectric layer 38c and at least a portion of cell electrode layer 40c. Further, silicon nitride comprising layer 46c also contacts at least a portion of electrically insulative material 70. Processing can then continue as described above with respect to the first described embodiment in formation of a DRAM bit line outwardly thereof in electrical connection with source/drain region 22, or otherwise.

Figure 12:
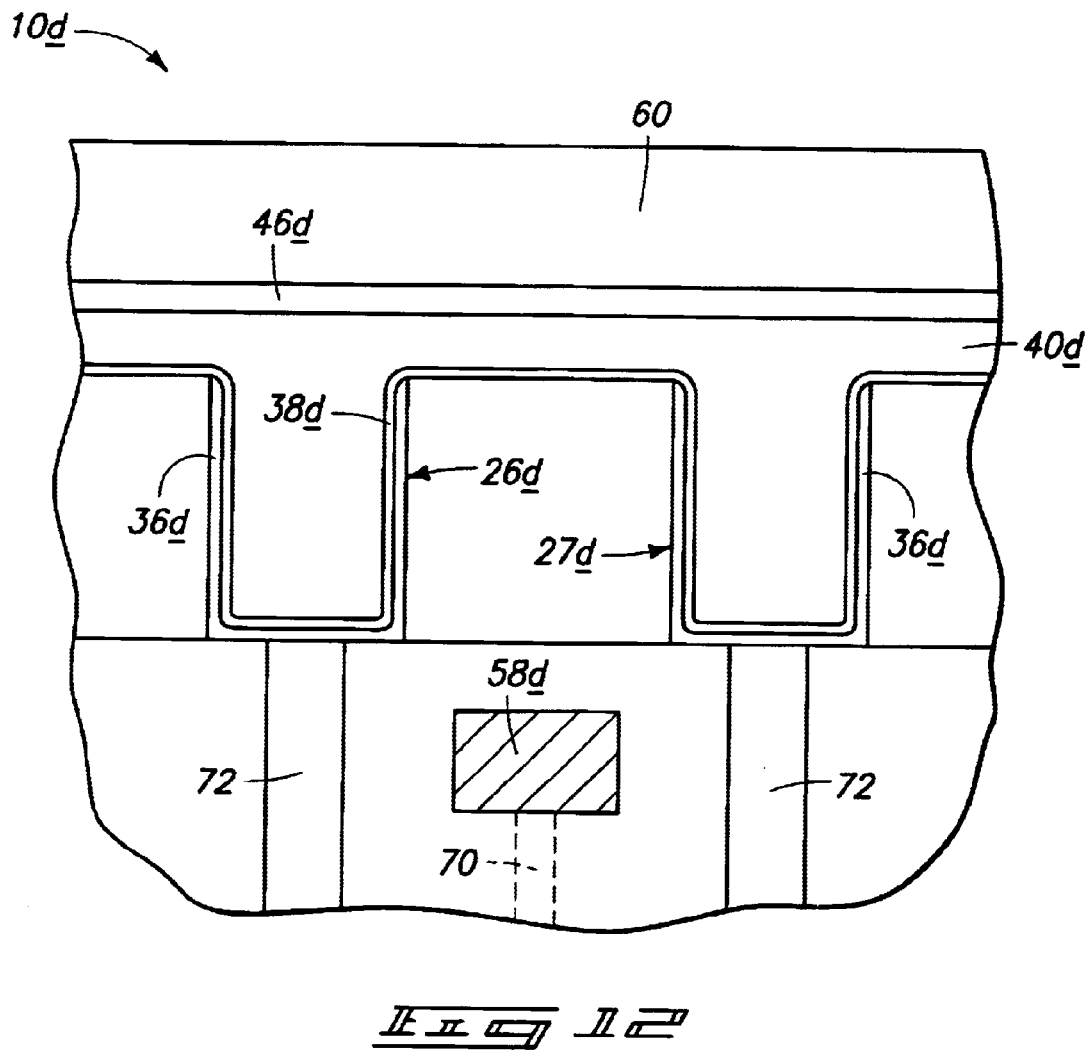
FIG. 12 is a view of still another alternate embodiment to that depicted by FIG. 1.

The above-described embodiments were with respect to bit line-over-capacitor constructions. FIG. 12 depicts but one exemplary alternate embodiment DRAM integrated circuitry fabrication involving a capacitor-over-bit line construction. Like numerals from the first described embodiment are utilized where appropriate, with differences being indicated with the suffix "d" or with different numerals. FIG. 12 depicts a semiconductor substrate fragment 10d comprising a DRAM bit line 58d formed in electrical connection via a conductive path 70 with a source/drain diffusion region 22 (not shown) formed within a monocrystalline silicon substrate (not shown), much like the first described embodiment. Capacitors 26d and 27d are formed elevationally outward of DRAM bit line 58d and in electrical connection with source/drain diffusion regions 20 and 24 (not shown) through conductive paths 72.

A silicon nitride comprising layer 46d is physical vapor deposited over DRAM cell capacitors 26d and 27d. Preferably and as shown, physical vapor deposited silicon nitride comprising layer 46d contacts at least a portion of DRAM cell capacitors 26d and 27d, in the depicted example by contacting DRAM cell electrode layer 40d. Other conductive layers or circuitry devices can be fabricated outwardly of physical vapor deposited silicon nitride comprising layer 46d. An outer final passivation layer 60 is shown formed outwardly of silicon nitride comprising layer 46d.

Preferably in all of the above-described embodiments, some subsequent anneal in a hydrogen containing atmosphere would be conducted for any one of the above-described, other existing, or yet-to-be developed reasons. Yet, the physical vapor deposited silicon nitride comprising layer in such instance(s) can undesirably function to shield such hydrogen anneal diffusion to other areas of the circuitry where such annealing might be desired away from directly over the capacitor constructions. Accordingly and most preferably, removal of the physical vapor deposited silicon nitride comprising layer occurs from the substrate laterally away from over the capacitor devices, so the subsequent hydrogen anneal can be effective to diffuse hydrogen to these other areas.

Figure 13:
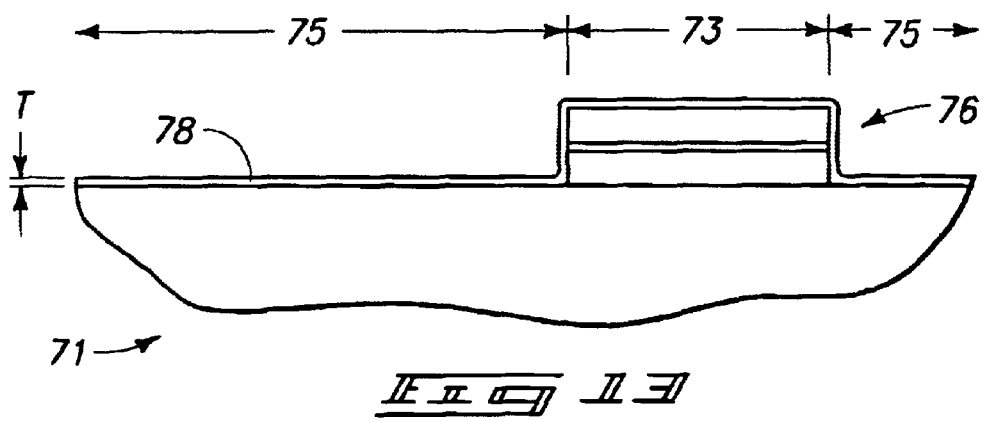
FIG. 13 is a view of yet still another alternate embodiment.

Accordingly, but one aspect of the invention further contemplates a method of forming integrated circuitry involving removing certain portions of a physical vapor deposited silicon nitride comprising layer relative to capacitor versus other area coverage, as well as to integrated circuitry independent of the method. By way of example only, FIG. 13 depicts a semiconductor wafer fragment 71 comprising integrated circuitry in fabrication. Such substrate comprises a first area 73 and a second area 75. A capacitor 76 is formed over first area 73 and covers all of such area. Alternate capacitor constructions and alternate areas from that depicted are of course contemplated. A silicon nitride comprising layer 78 is received over capacitor 76 and the first and second areas, and preferably as shown contacts capacitor 76. Such is preferably formed by physical vapor depositing. The silicon nitride comprising layer can be considered as having some thickness "T" over at least some of second area 75.

Figure 14:
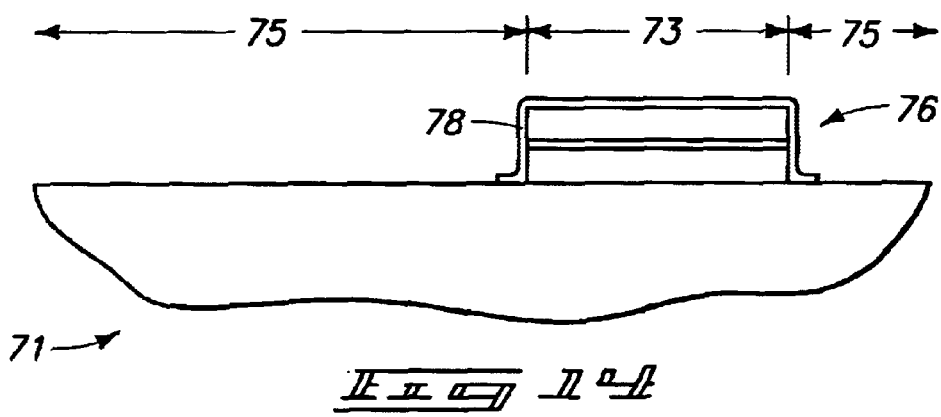
FIG. 14 is a view of the FIG. 13 wafer fragment at a processing step subsequent to that depicted by FIG. 13.

Referring to FIG. 14, all of thickness T of at least a portion of physical vapor deposited silicon nitride comprising layer 78 is removed, preferably by patterning and etching, from over second area 75. Such provides but one example of a silicon nitride comprising layer received over all of capacitor 76, yet not over all of second area 75. Subsequently, annealing of the substrate is preferably conducted in a hydrogen comprising atmosphere, whereby capacitor 76 is largely shielded from such annealing by a silicon nitride comprising layer 78, while second area 75 is preferably largely left accessible to hydrogen diffusion from such annealing.

Figure 15:
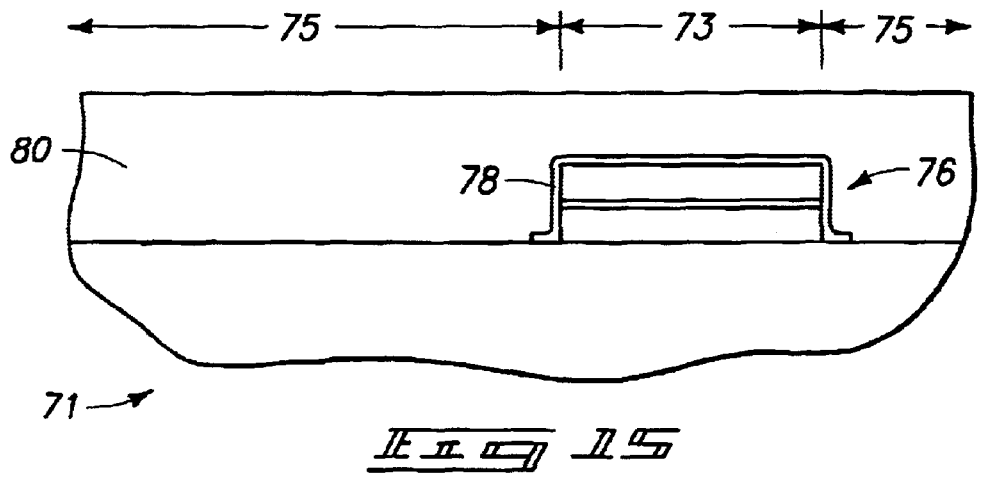
FIG. 15 is a view of the FIG. 13 wafer fragment at a processing step subsequent to that depicted by FIG. 14.

Referring to FIG. 15, a final passivation layer 80 is formed over silicon nitride comprising layer 78. The subject annealing might be conducted either before or after provision of passivation layer 80.

Figure 16:
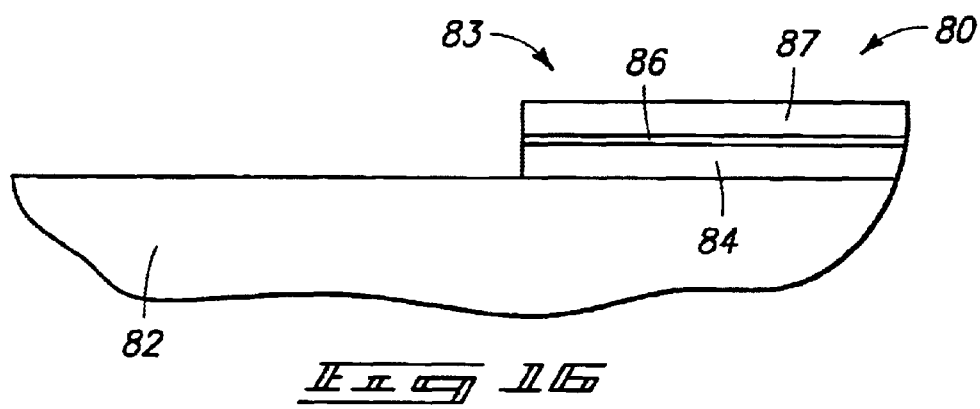
FIG. 16 is a view of another alternate embodiment.

FIG. 16 depicts a prior art semiconductor wafer fragment 80 comprised of some substrate 82 having a capacitor construction 83 in fabrication formed thereover. Such comprises a lower or bottom electrode layer 84, a capacitor dielectric layer 86, and a top or outer electrode layer 87. Materials are typically and preferably as described above with respect to the first described embodiment.

Figure 17:
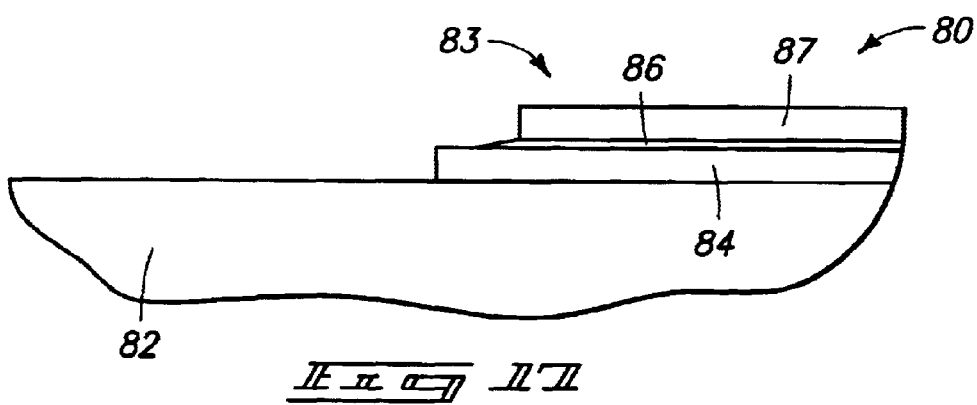
FIG. 17 is a view of the FIG. 16 wafer fragment at a processing step subsequent to that depicted by FIG. 16.

Referring to FIG. 17, outer electrode 87 is masked and etched substantially selectively relative to capacitor dielectric layer 86. Then, a highly selective etch can be conducted resulting in a substantial edge separation between the capacitor electrodes. An example preferred etch is a wet etch. For example, where the electrodes comprise platinum, a preferred wet etch chemistry comprises a mixture of HCl and $H_2SO_4$.

Figure 18:
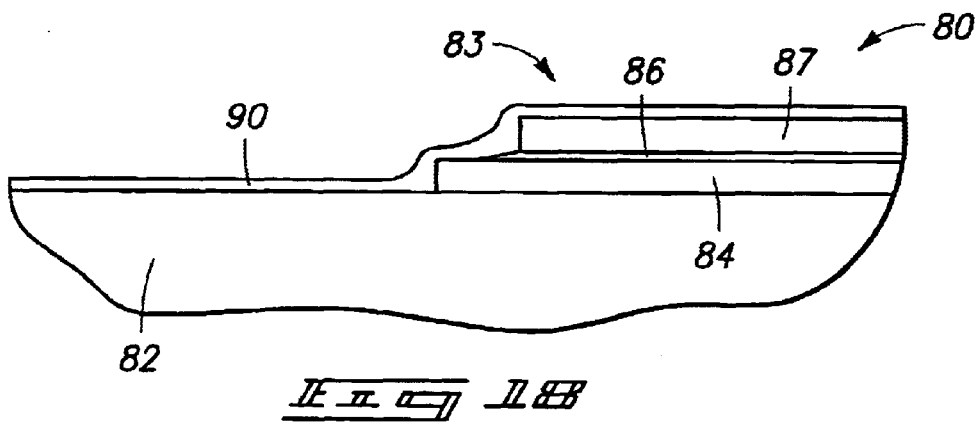
FIG. 18 is a view of the FIG. 16 wafer fragment at a processing step subsequent to that depicted by FIG. 17.

Referring to FIG. 18, a silicon nitride comprising layer 90 is physical vapor deposited over and preferably on the illustrated components for reasons described above, or for other reasons, including yet-to-be developed reasons.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. Integrated circuitry, comprising:
    a first capacitor electrode layer received over a substrate, the first capacitor electrode layer having opposing lateral edges;
    a capacitor dielectric layer received over the first capacitor electrode layer, the capacitor dielectric layer comprising an edge terminus;
    a second capacitor electrode layer received over the capacitor dielectric layer; the second capacitor electrode layer having opposing lateral edges; the first capacitor electrode layer, the capacitor dielectric layer and the second capacitor electrode layer comprising a capacitor;
    the capacitor dielectric layer edge terminus being laterally coincident with at least a portion of one of the opposing lateral edges of the second capacitor electrode layer; and
    an insulative silicon nitride comprising cap received over the capacitor dielectric layer edge terminus and the one opposing lateral edge of the second capacitor electrode layer, the cap not contacting any portion of the opposing lateral edges of the first capacitor electrode layer.

2. DRAM integrated circuitry comprising:
    a DRAM wordline received over a substrate, the DRAM wordline comprising a gate of a DRAM cell field effect transistor which has a pair of source/drain regions;

a DRAM bit line in electrical connection with one of the pair of source/drain regions;

a DRAM cell capacitor received elevationally outward of the DRAM bit line and in electrical connection with the other of the pair of source/drain regions; and a silicon nitride comprising layer received over and contacting at least a portion of the DRAM cell capacitor.

3. DRAM integrated circuitry comprising:

a DRAM wordline received over a substrate, the DRAM wordline comprising a gate of a DRAM cell field effect transistor which has a pair of source/drain regions;

an insulative layer received outwardly of the DRAM wordline and a capacitor container opening within the insulative wordline, the container opening having sidewalls;

a diffusion barrier material lining the sidewalls of the container opening;

a DRAM cell capacitor storage node layer received within the container opening in electrical connection with one of the pair of source/drain regions;

a capacitor dielectric layer received within the container opening over the storage node layer;

a DRAM cell capacitor cell electrode layer received within the container opening over the capacitor dielectric layer;

an electrically insulative material received within the container opening over the DRAM cell capacitor cell electrode layer;

a silicon nitride comprising layer received over the electrically insulative material and the cell electrode layer; and a DRAM bit line received over the silicon nitride comprising layer.

4. The integrated circuitry of claim 1, wherein the cap contacts the capacitor dielectric layer edge terminals and the one opposing lateral edge of the second capacitor electrode layer.

5. The integrated circuitry of claim 1 wherein the cap consists essentially of silicon nitride.

6. The integrated circuitry of claim 2 wherein the silicon nitride comprising layer consists essentially of silicon nitride.

7. The integrated circuitry of claim 2 wherein the silicon nitride comprising layer contacts a capacitor dielectric layer of the capacitor.

8. The integrated circuitry of claim 6 wherein the silicon nitride comprising layer contacts an outermost electrode of the capacitor.

9. The integrated circuitry of claim 7 wherein the silicon nitride comprising layer contacts a capacitor dielectric layer of the capacitor and contacts an outermost electrode of the capacitor.

10. The integrated circuitry of claim 3 wherein the silicon nitride comprising layer consists essentially of silicon nitride.

11. The integrated circuitry of claim 6 wherein the electrically insulative material comprises an oxide.

12. The integrated circuitry of claim 3 wherein the electrically insulative material comprises PSG.

13. The integrated circuitry of claim 3 wherein the diffusion barrier material comprises silicon nitride.

14. The integrated circuitry of claim 4 wherein the silicon nitride comprising layer contacts at least a portion of the cell electrode layer.

15. The integrated circuitry of claim 4 wherein the silicon nitride comprising layer consists essentially of silicon nitride and contacts at least a portion of the cell electrode layer.

16. The integrated circuitry of claim 4 wherein the silicon nitride comprising layer contacts at least a portion of the electrically insulative material.

17. The integrated circuitry of claim 3 wherein the silicon nitride comprising layer contacts at least a portion of the electrically insulative material and contacts at least a portion of the cell electrode layer.

18. Integrated circuitry comprising:

a first capacitor electrode layer received over a substrate, the first capacitor electrode layer having a top surface and opposing lateral edges;

a capacitor dielectric layer received over the first capacitor electrode layer, the capacitor dielectric layer comprising an edge terminus;

a second capacitor electrode layer received over the capacitor dielectric layer; the second capacitor electrode layer having opposing lateral edges; the first capacitor electrode layer, the capacitor dielectric layer and the second capacitor electrode layer comprising a capacitor;

the capacitor dielectric layer edge terminus being laterally coincident with at least a portion of one of the opposing lateral edges of the second capacitor electrode layer; and an insulative silicon nitride comprising cap received over the capacitor dielectric layer edge terminus and the one opposing lateral edge of the second capacitor electrode layer, the cap not contacting any portion of the first capacitor electrode layer top surface.

19. The integrated circuitry of claim 18 wherein the cap contacts the capacitor dielectric layer edge terminus and the one opposing lateral edge of the second capacitor electrode layer.

20. The integrated circuitry of claim 18 wherein the cap consists essentially of silicon nitride.

* * * * *

UNITED STATES PATENT AND TRADEMARK OFFICE
CERTIFICATE OF CORRECTION

PATENT NO. : 6,707,088 B2
DATED : March 16, 2004
INVENTOR(S) : Fred Fishburn

It is certified that error appears in the above-identified patent and that said Letters Patent is hereby corrected as shown below:

Title page,
Item [54], Title, please delete the title and insert the following: -- INTEGRATED CIRCUITRY, INCLUDING DRAM INTEGRATED CIRCUITRY --

Column 5,
Line 55, please delete "11" and "capacitor".

Column 9,
Line 36, please delete "terminal" after "edge" and insert -- terminus --.
Line 47, please delete "6" after "claim" and insert -- 2 --.
Line 49, please delete "7" after "claim" and insert -- 2 --.

Column 10,
Lines 4, please delete "6" after "claim" and insert -- 3 --.
Lines 10, 13 and 16, please delete "4" after "claim" and insert -- 3 --.

Signed and Sealed this

Seventh Day of December, 2004

JON W. DUDAS
*Director of the United States Patent and Trademark Office*